United States Patent
Kim et al.

(10) Patent No.: US 8,982,635 B2
(45) Date of Patent: Mar. 17, 2015

(54) SEMICONDUCTOR MEMORY DEVICE AND WRITING METHOD THEREOF

(71) Applicant: SK Hynix Inc., Icheon-si Gyeonggi-do (KR)

(72) Inventors: Tae Gyun Kim, Icheon-si (KR); Chi Wook An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 39 days.

(21) Appl. No.: 13/924,068

(22) Filed: Jun. 21, 2013

(65) Prior Publication Data

US 2014/0233308 A1 Aug. 21, 2014

(30) Foreign Application Priority Data

Feb. 21, 2013 (KR) .................. 10-2013-0018595

(51) Int. Cl.
- *G11C 16/10* (2006.01)
- *G11C 16/28* (2006.01)
- *G11C 16/04* (2006.01)

(52) U.S. Cl.
CPC ............ *G11C 16/10* (2013.01); *G11C 16/0483* (2013.01); *G11C 16/28* (2013.01)
USPC .............. 365/185.2; 365/185.17; 365/185.21; 365/185.28; 365/189.07

(58) Field of Classification Search
CPC ..... G11C 16/0483; G11C 16/10; G11C 16/28
USPC .............. 365/185.19, 185.18, 185.28, 185.23
See application file for complete search history.

(56) References Cited

U.S. PATENT DOCUMENTS

| | | | |
|---|---|---|---|
| 7,817,473 B2* | 10/2010 | Lee et al. | ............... 365/185.17 |
| 2002/0050607 A1 | 5/2002 | Nakamura et al. | |
| 2006/0203565 A1* | 9/2006 | Lee et al. | ............... 365/185.29 |
| 2009/0257280 A1* | 10/2009 | Oh et al. | ............... 365/185.19 |

FOREIGN PATENT DOCUMENTS

| | | |
|---|---|---|
| KR | 1020070002319 A | 1/2007 |
| KR | 1020080096234 A | 10/2008 |

* cited by examiner

*Primary Examiner* — Ly D Pham
(74) *Attorney, Agent, or Firm* — William Park & Associates Patent Ltd.

(57) ABSTRACT

A writing method of a semiconductor memory device includes applying a plurality of program voltages sequentially generated to a selected word line, and applying any one of a plurality of source selection line voltages to a source selection line when each of the plurality of program voltages is applied.

17 Claims, 9 Drawing Sheets

| | SELECTED WORD LINE | UNSELECTED WORD LINE | DRAIN SELECTION LINE | SOURCE SELECTION LINE |
|---|---|---|---|---|
| FIRST PROGRAM OPERATION | Vpgm 1 | | | Vssl 1 |
| SECOND PROGRAM OPERATION | Vpgm 2 | | | Vssl 2 |
| THIRD PROGRAM OPERATION | Vpgm 3 | Vpass | Vdsl | Vssl 3 |
| | ⋮ | | | ⋮ |
| P-TH PROGRAM OPERATION | Vpgm P | | | Vssl P |

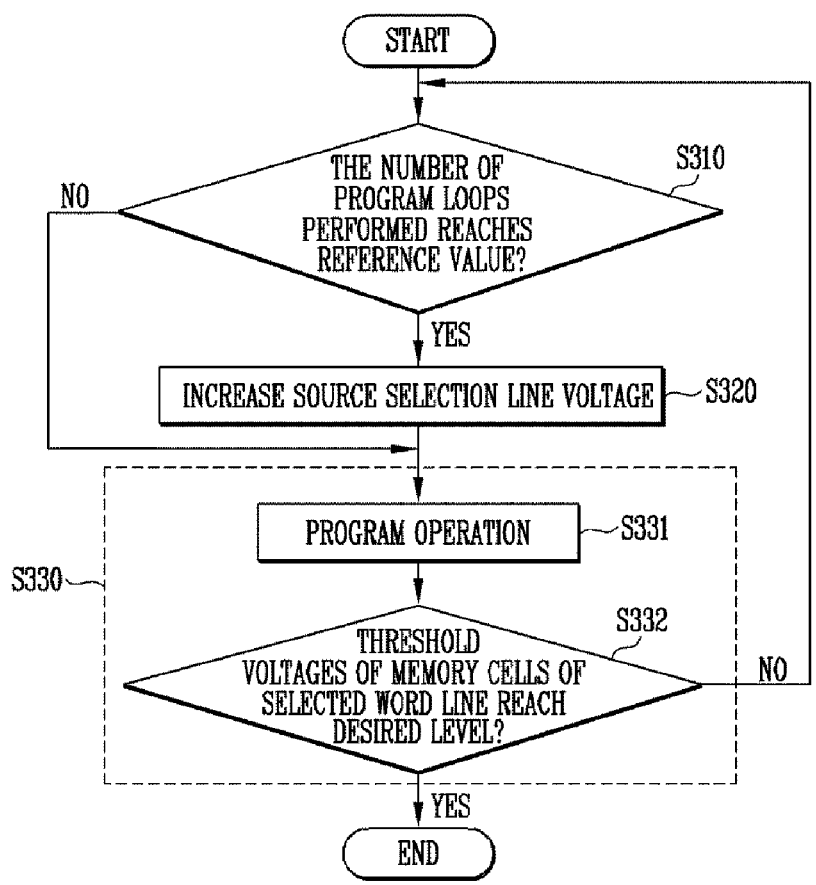
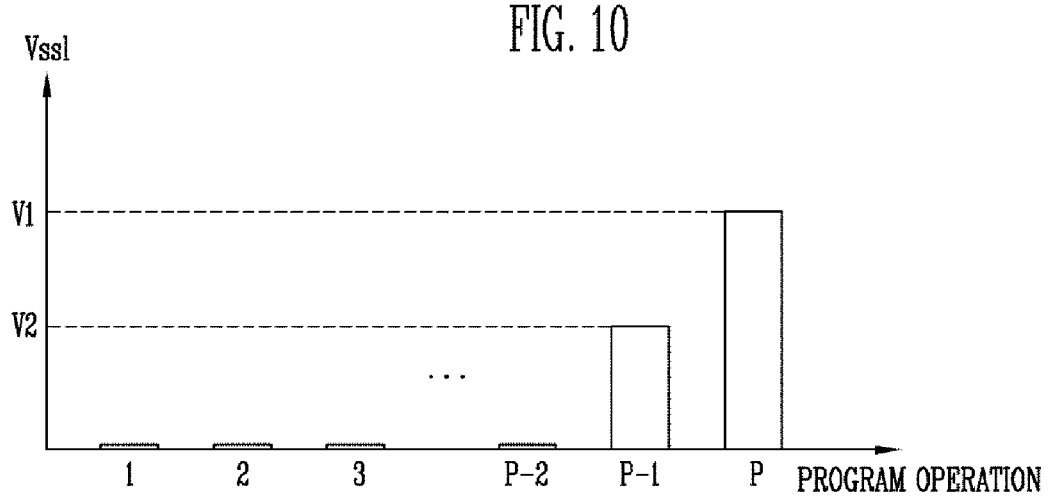

SEMICONDUCTOR MEMORY DEVICE AND WRITING METHOD THEREOF

CROSS-REFERENCE TO RELATED APPLICATION

The present application claims priority to Korean patent application number 10-2013-0018595 filed on Feb. 21, 2013, in the Korean Intellectual Property Office, the entire disclosure of which is incorporated by reference herein.

BACKGROUND

1. Technical Field

Various embodiments relate generally to an electronic device and, more particularly, to a semiconductor memory device and a writing method thereof.

2. Related Art

A semiconductor memory device is a storage device that is realized using a semiconductor made from, for example, silicon (Si), germanium (Ge), gallium arsenide (GaAs), or indium phosphide (InP). Semiconductor memory devices can be classified as volatile memory devices or nonvolatile memory devices.

A volatile memory device is unable to retain its stored data when the power is turned off. The volatile memory device includes a static random access memory (SRAM) device, a dynamic RAM (DRAM) device, a synchronous DRAM (SDRAM) device, or the like. A non-volatile memory device can retain its stored data even when powered off. The non-volatile memory device may include a read only memory (ROM) device, a programmable ROM (PROM) device, an electrically programmable ROM (EPROM) device, an electrically erasable and programmable ROM (EEPROM) device, a flash memory device, a phase-change RAM (PRAM) device, a magnetic RAM (MRAM) device, a resistive RAM (RRAM) device, a ferroelectric RAM (FRAM) device, or the like. A flash memory device may be classified as a NOR type or a NAND type.

The degree of integration associated with a semiconductor memory device has gradually increased over time. However, with the increased degree of integration of the semiconductor memory device, problems have arisen in the operations of the semiconductor memory device. As a result, these problems may affect the reliability of the semiconductor memory device.

BRIEF SUMMARY

Various embodiments may relate to a semiconductor memory device having improved reliability.

A writing method of a semiconductor memory device according to an embodiment of the present invention may include applying a plurality of program voltages sequentially generated to a selected word line, and applying any one of a plurality of source selection line voltages to a source selection line when each of the plurality of program voltages is applied.

A semiconductor memory device according to an embodiment of the present invention may include a memory cell array including a plurality of memory cells and source selection transistors coupled between the plurality of memory cells and a common source line, and a peripheral circuit configured to write data in selected memory cells, among the plurality of memory cells, by performing a plurality of program operations, wherein the peripheral circuit is configured to apply any one of a plurality of source selection line voltages to the source selection transistors when each of the plurality of program operations is performed.

A semiconductor memory device according to other embodiments of the present invention may include a memory cell array coupled to a drain selection line, a source selection line and a plurality of word lines between the drain selection line and the source selection line, a word line voltage generator configured to generate a plurality of program voltages to be applied to a selected word line, among the plurality of word lines, during a write operation, and a first selection line voltage generator configured to generate any one of the plurality of source selection line voltages when the plurality of program voltages are generated, wherein the source selection line voltage generated by the first selection line voltage generator is applied to the source selection line.

A writing method pertaining to a computer system including a central processing unit and a semiconductor memory device, the writing method, according to an embodiment of the present invention, may include applying a plurality of program voltages sequentially generated to a selected word line, and applying any one of a plurality of source selection line voltages to a source selection line when each of the plurality of program voltages is applied.

A computer system including a semiconductor memory device and a central processing unit, the semiconductor memory device, according to an embodiment of the present invention, may include a memory cell array including a plurality of memory cells and source selection transistors coupled between the plurality of memory cells and a common source line, and a peripheral circuit configured to write data in selected memory cells, among the plurality of memory cells, by performing a plurality of program operations, wherein the peripheral circuit is configured to apply any one of a plurality of source selection line voltages to the source selection transistors when each of the plurality of program operations is performed.

A computer system including a semiconductor memory device and a central processing unit, the semiconductor memory device, according to other embodiments of the present invention, may include a memory cell array coupled to a drain selection line, a source selection line and a plurality of word lines between the drain selection line and the source selection line, a word line voltage generator configured to generate a plurality of program voltages to be applied to a selected word line, among the plurality of word lines, during a write operation, and a first selection line voltage generator configured to generate any one of the plurality of source selection line voltages when the plurality of program voltages are generated, wherein the source selection line voltage generated by the first selection line voltage generator is applied to the source selection line.

A writing method of a semiconductor memory device according to an embodiment of the present invention may include applying a plurality of program voltages to a selected word line, and applying a source selection line voltage to a source selection line each time a program voltage is applied.

BRIEF DESCRIPTION OF THE DRAWINGS

FIG. 6 is a flowchart illustrating an embodiment of the write operation of a semiconductor memory device;

FIG. 9 is a flowchart illustrating an embodiment of the write operation of the semiconductor memory device;

FIG. 10 is a graph illustrating a third example associated with various embodiments relating to the source selection line voltage during the write operation;

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
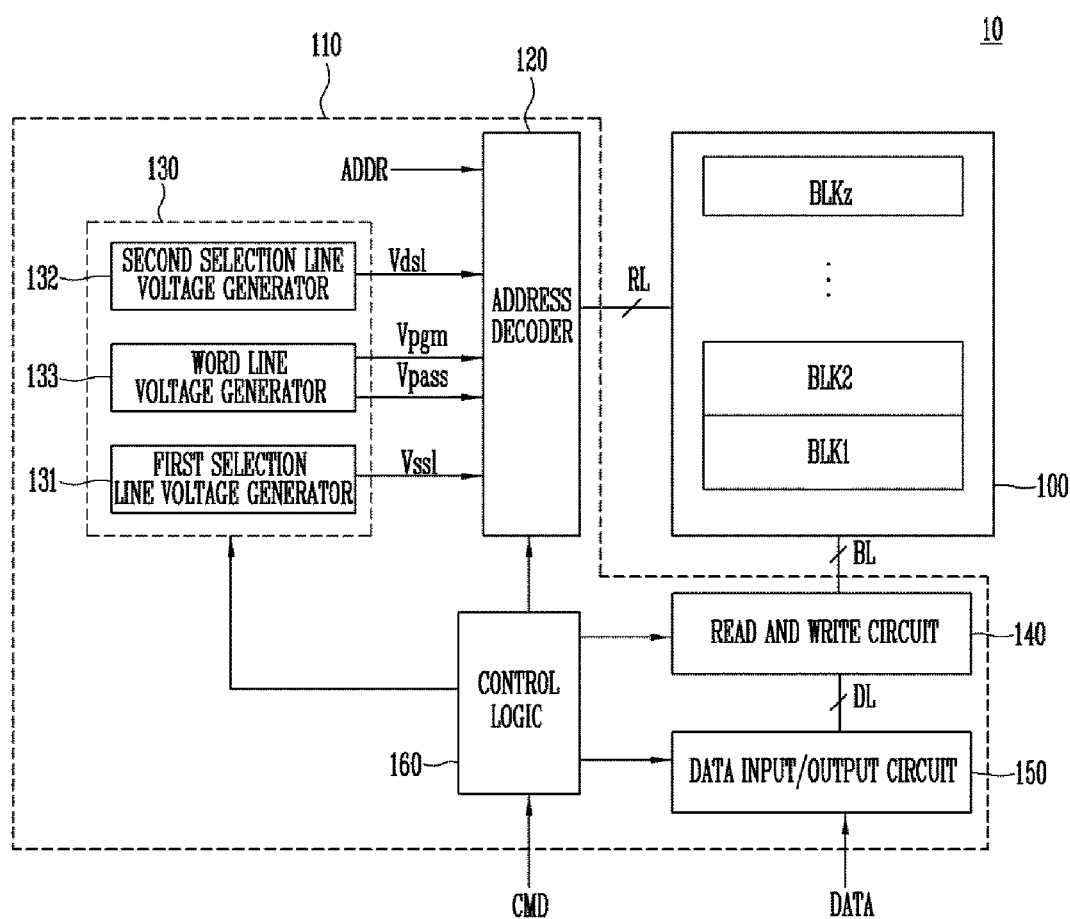
FIG. 1 is a block diagram of a semiconductor memory device according to an embodiment of the present invention.
Figure 2:
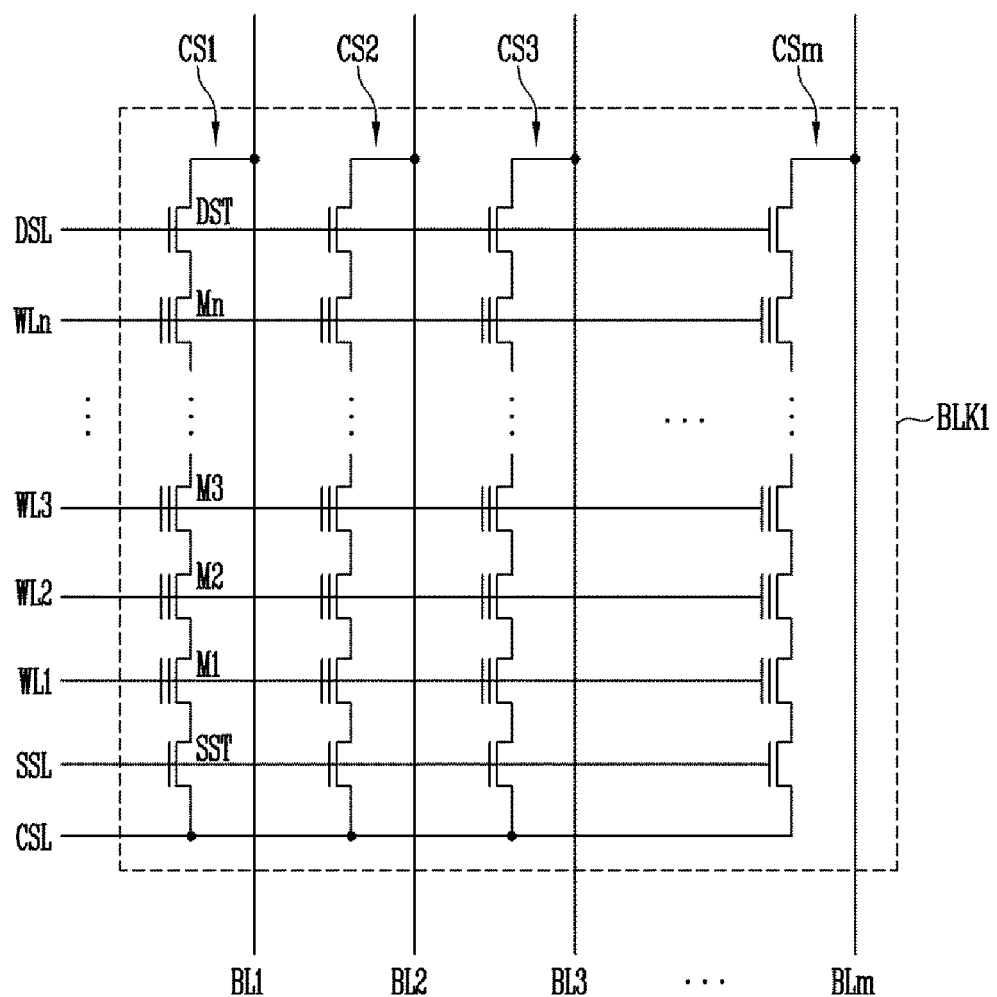
FIG. 2 is a circuit diagram of any one of a plurality of memory blocks of FIG. 1.

FIG. 1 is a block diagram of a semiconductor memory device 10 according to an embodiment of the present invention. FIG. 2 is a circuit diagram of any one of memory blocks BLK1 to BLKz of FIG. 1, for example, the memory block BLK1.

Referring to FIG. 1, the semiconductor memory device 10 may include a memory cell array 100 and peripheral circuits 110 that control the memory cell array 100. The peripheral circuits 110 may include an address decoder 120, a voltage generator 130, a read and write circuit 140, a data input/output circuit 150 and a control logic 160.

The memory cell array 100 may include memory blocks BLK1 to BLKz. The memory blocks BLK1 to BLKz may be coupled to the address decoder 120 through row lines RL and coupled to the read and write circuit 140 through bit lines BL.

With reference to FIG. 2, the memory block BLK1 may include first to m-th cell strings CS1 to CSm. The first to m-th cell strings CS1 to CSm may be coupled to first to m-th bit lines BL1 to BLm, respectively.

Each of the cell strings CS1 to CSm may include a source selection transistor SST, a plurality of memory cells M1 to Mn coupled in series with each other, and a drain selection transistor DST. The source selection transistor SST may be coupled to a source selection line SSL. The first to n-th memory cells M1 to Mn may be coupled to first to n-th word lines WL1 to WLn, respectively. The drain selection transistor DST may be coupled to the drain selection line DSL. A source of the source selection transistor SST may be coupled to a common source line CSL. A drain of the drain selection transistor DST may be coupled to a corresponding one of the bit lines. The row lines RL of FIG. 1 may include the source selection line SSL, the first to n-th word lines WL1 to WLn and the drain selection line DSL. The source selection line SSL, the first to n-th word lines WL1 to WLn and the drain selection line DSL may be driven by the address decoder 120. The common source line CSL may be driven by a common source line controller (not illustrated) that is controlled by the control logic 160.

Memory cells coupled to a single word line may construct at least one page. When each of the memory cells is a single level cell, the memory cells coupled to the single word line may form a single page. When each of the memory cells is a multi level cell, the memory cells coupled to the single word line may form at least two pages.

According to an embodiment, the memory cells of the memory block BLK1 may be non-volatile memory cells.

Referring again to FIG. 1, the address decoder 120 may be coupled to the memory cell array 100 through the row lines RL. The address decoder 120 may be configured to operate under the control of the control logic 160. The address decoder 120 may receive addresses ADDR through a global buffer (not illustrated) in the semiconductor memory device 10.

A write operation of the semiconductor memory device 10 may be performed in page units. The addresses ADDR that the address decoder 120 receives in order to perform the write operation may include a block address and a row address.

The address decoder 120 is configured to decode the block address, among the received addresses ADDR, during the write operation. The address decoder 120 may select a single memory block in response to the decoded block address.

During the write operation, the address decoder 120 is configured to decode the row address among the received addresses ADDR. The address decoder 120 may select a single word line, from among the word lines WL1 to WLn (see FIG. 2) coupled to a selected memory block, in response to the decoded row address. The address decoder 120 may apply a program voltage Vpgm to the word line, selected in response to the decoded row address; apply a pass voltage Vpass to unselected word lines; apply a source selection line voltage Vssl to the source selection line SSL (see FIG. 2); and apply a drain selection line voltage Vds1 to the drain selection line DSL (see FIG. 2).

The address decoder 120 may include an address buffer, a block decoder and a row decoder.

The voltage generator 130 may include first and second selection line voltage generators 131 and 132 and a word line voltage generator 133. The first and second selection line voltage generators 131 and 132 and the word line voltage generator 133 may operate in response to the control of the control logic 160.

The first selection line voltage generator 131 is configured to generate any one of a plurality of source selection line voltages, i.e., the source selection line voltage Vssl, each time a program operation is performed. In other words, the source selection line voltage Vssl may vary. These source selection line voltages may be between a power voltage and a ground voltage.

The write operation may include a plurality of program operations. In other words, the memory cells of the selected word line may be programmed by repeating a program operation and a verify operation. For example, the memory cells of the selected word line may be programmed by an incremental step pulse programming (ISPP) method. According to an embodiment of the present invention, when each of the program operations is performed, one of the source selection line voltages may be selected and applied to the source selection line SSL. This will be described in more detail with reference to FIGS. 5 to 11.

The second selection line voltage generator 132 is configured to generate the drain selection line voltage Vdsl. For example, the drain selection line voltage Vdsl may be the power voltage.

The word line voltage generator 133 is configured to generate the program voltage Vpgm and the pass voltage Vpass. Each of the program voltage Vpgm and the pass voltage Vpass may be a high voltage, and the program voltage Vpgm may be higher than the pass voltage Vpass. According to an embodiment, the word line voltage generator 133 may include a plurality of pumping capacitors that receive the power voltage, and the word line voltage generator 133 may generate the program voltage Vpgm and the pass voltage Vpass by selectively activating the plurality of pumping capacitors in response to the control of the control logic 160.

The read and write circuit 140 may be coupled to the memory cell array 100 through the bit lines BL1 to BLm and coupled to the data input/output circuit 150 through data lines DL. The read and write circuit 140 may operate in response to the control of the control logic 160.

The read and write circuit 140 may communicate data DATA with the data input/output circuit 150. During the write operation, the read and write circuit 140 may receive and store the data DATA through the data input/output circuit 150 and transfer the stored data DATA to the bit lines BL1 to BLm. Data may be written in the memory cells of the selected word line in response to the data DATA.

According to an embodiment, the read and write circuit 140 may include page buffers (or page registers) and a column selection circuit.

The data input/output circuit 150 may be coupled to the read and write circuit 140 through the data lines DL. The data input/output circuit 150 may operate in response to the control of the control logic 160. During the write operation, the data input/output circuit 150 may receive the data DATA from the global buffer (not illustrated) in the semiconductor memory device 10 and transfer the received data DATA to the read and write circuit 140 through the data lines DL.

The control logic 160 may receive a command CMD through the global buffer of the semiconductor memory device 10, for example, a command which indicates a write operation. The control logic 160 may transfer control signals to the address decoder 120, the voltage generator 130, the read and write circuit 140 and the data input/output circuit 150 in response to the command CMD to control the general operation of the semiconductor memory device 10.

Figure 3:
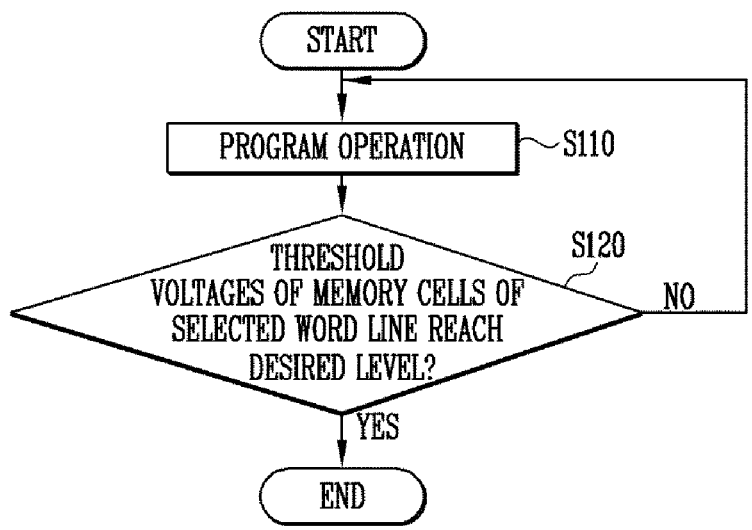
FIG. 3 is a flowchart illustrating a write operation of the semiconductor memory device illustrated in FIG. 1.

FIG. 3 is a flowchart illustrating a write operation of the semiconductor memory device 10.

Referring to FIG. 3, a program operation may be performed at step S110. When the program operation is performed, threshold voltages of the memory cells of the selected word line may increase.

A verify operation may be performed to determine whether the threshold voltages of the memory cells of the selected word line reach a desired level at step S120. If it is determined that the threshold voltages of the memory cells reach the desired level (i.e., YES), the write operation may be terminated. Otherwise, the write operation of the semiconductor memory device 10 may proceed back with step S110 (i.e., NO).

Step S110 and Step S120 may form a single program loop. In other words, a write operation may be performed by repeating a plurality of program loops.

Figure 4:
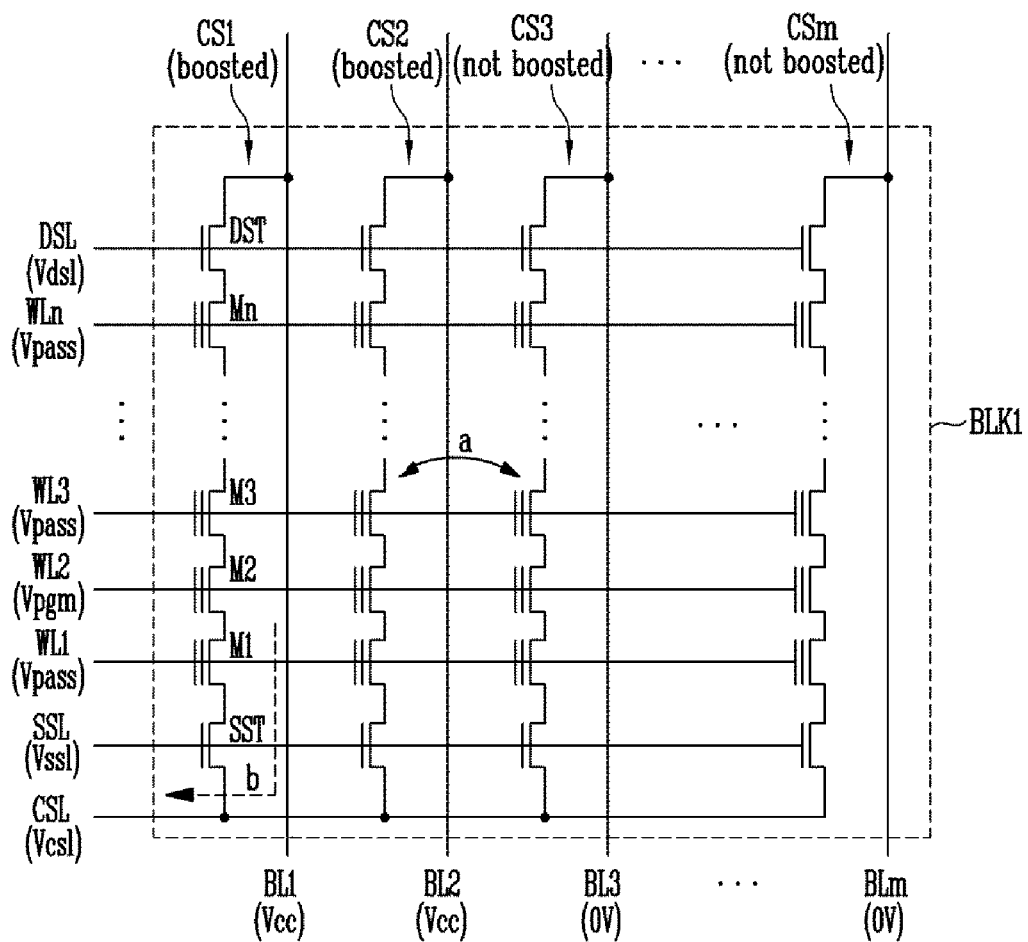
FIG. 4 is a view illustrating bias conditions of a selected memory block when a program operation is performed.

FIG. 4 is a view illustrating bias conditions of a selected memory block (e.g., BLK1) when a program operation is performed. For FIG. 4, like reference characters refer to like elements described above with reference to FIGS. 1 and 2.

Referring to FIG. 4, the program voltage Vpgm may be applied to a selected word line (e.g., WL2), the pass voltage Vpass may be applied to unselected word lines (e.g., WL1 and WL3 to WLn), the source selection line voltage Vssl may be applied to the source selection line SSL (see FIG. 2), and the drain selection line voltage Vds1 may be applied to the drain selection line DSL (see FIG. 2). For the convenience of description, it is assumed that the drain selection line voltage Vds1 is the power voltage.

A power voltage Vcc or a ground voltage (e.g., 0V) may be applied to the bit lines BL1 to BLm in response to the data DATA (see FIG. 1) to be written in the memory cells of the selected word line. The ground voltage may be applied to a bit line coupled to a memory cell whose threshold voltage will increase (hereinafter, referred to as a "programmed cell"). The power voltage Vcc may be applied to a bit line coupled to a memory cell whose threshold voltage will be maintained (hereinafter, referred to as a "program-inhibited cell"). As illustrated in FIG. 4, the power voltage Vcc may be applied to the first and second bit lines BL1 and BL2, and the ground voltage may be applied to the third and m-th bit lines BL3 and BLm.

A common source line voltage Vcsl may be applied to the common source line CSL.

Channels of cell strings including program-inhibited cells may be boosted. Each of the first and second cell strings CS1 and CS2 may be electrically insulated from a corresponding one of the bit lines by the power voltage Vcc of the corresponding bit line and the power voltage of the drain selection line DSL. The source selection transistor SST of each of the cell strings may be turned off by the source selection line voltage Vssl. Each channel of the first and second cell strings CS1 and CS2 may be boosted by the program voltage Vpgm and the pass voltage Vpass.

Channels of cell strings that include programmed cells may not be boosted. Each of the third and m-th cell strings CS3 and CSm may be electrically coupled to a corresponding one of the bit lines by the ground voltage of the corresponding bit line and the power voltage of the drain selection line DSL. Therefore, each channel of the third and m-th cell strings CS3 and CSm may be maintained at the ground voltage of the corresponding bit line (ground voltage).

When the second cell string CS2 to be boosted is adjacent to the third cell string CS3 not to be boosted, a channel voltage of the second cell string CS2 may not normally increase due to a channel voltage (ground voltage) of the third cell string CS3. In other words, coupling (a) between the second cell string CS2 and the third cell string CS3 may prevent the channel voltage of the second cell string CS2 from increasing normally. The coupling (a) between the second and third cell strings CS2 and CS3 may reduce the reliability of the program operation. In addition, as the degree of integration of the memory cell array 100 increases, the effect of the coupling (a) therebetween may increase.

It is assumed that the source selection line voltage Vssl is a relatively high voltage. The source selection transistor SST of the third cell string CS3 may be slightly turned on due to the source selection line voltage Vssl having a relatively high voltage level. The channel voltage of the third cell string CS3 may be increased by the common source line voltage Vcsl, for example, 1V to 2V. Therefore, since the potential difference between the second and third cell strings CS2 and CS3 is reduced, the second cell string CS2 may be boosted more efficiently.

The first cell string CS1 to be boosted may be adjacent to the second cell string CS2 to be boosted. Therefore, the channel voltage of the first cell string CS1 may increase to a relatively high voltage level. At this time, drain induced barrier lowering (DIBL) may undesirably occur, and a leakage current (b) may occur from the channel of the first cell string CS1. For example, the leakage current (b) may flow from the channel of the first cell string CS1 to the common source line CSL through the source selection transistor SST. The leakage current (b) may reduce the reliability of the program operation.

It is assumed that the source selection line voltage Vssl is a relatively low voltage, for example, a ground voltage. The source selection transistor SST may efficiently suppress the leakage current (b), and the first cell string CS1 may be boosted more efficiently.

According to an embodiment of the present invention, when a plurality of program operations is performed, a plurality of source selection line voltages may be used. In other words, when each of the program operations is performed, the source selection line voltage Vssl may be selected and varied. Therefore, the channel voltage of the second cell string CS2 may not be prevented from increasing normally even when the second cell string CS2 to be boosted is adjacent to the third cell string CS3, and the channel voltage of any one of the first and second cell strings CS1 and CS2 to be boosted, for example, the channel voltage of the first cell string CS1 may not be prevented from increasing normally even when the first and second cell strings CS1 and CS2 to be boosted are adjacent to each other. Accordingly, the reliability of the write operation of the semiconductor memory device 10 may be improved.

Figure 5:
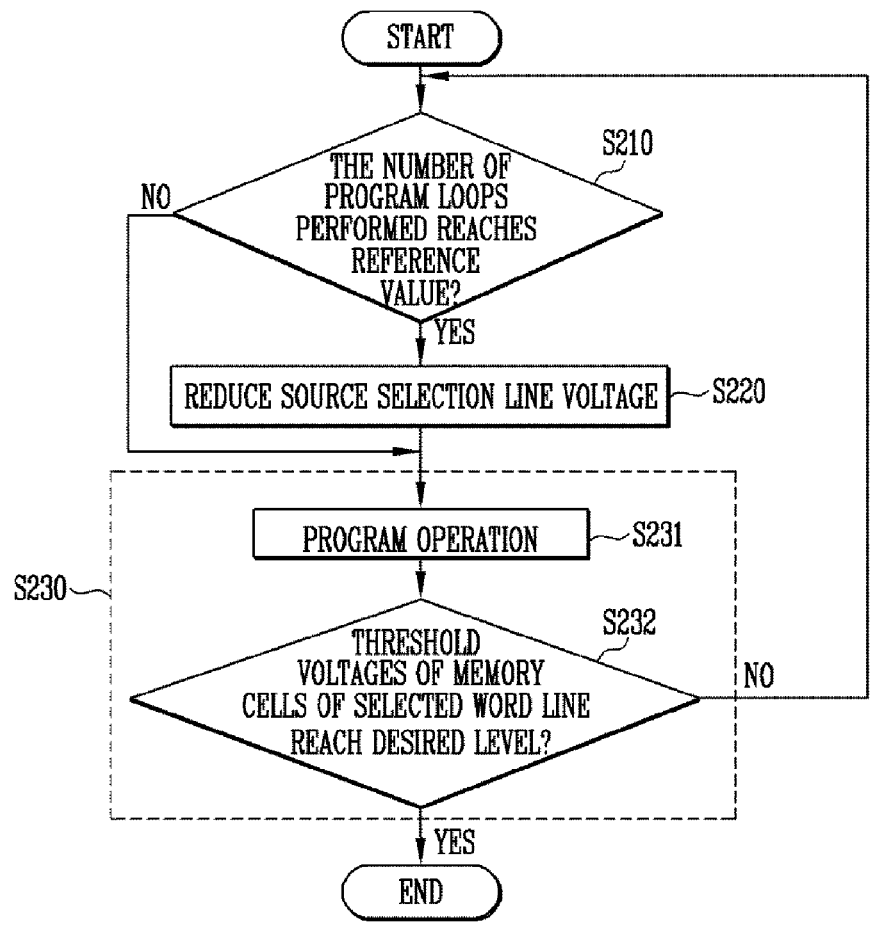
FIG. 5 is a table showing voltages applied to the selected memory block when each program operation is performed.

FIG. 5 is a table showing voltages applied to the selected memory block when program operations are performed. For the convenience of description, it is assumed that the first memory block BLK1 (see FIG. 2) is selected.

Referring to FIGS. 2 and 5, the write operation may include a plurality of program operations. When first to P-th program operations are performed, first to P-th program voltages Vpgm1 to VpgmP may be applied to the selected word line. Each time the program operation is performed, the program voltage may increase. In other words, the first to P-th program voltages Vpgm1 to VpgmP may gradually increase.

When the first to P-th program operations are performed, the pass voltage Vpass may be applied to the unselected word line, and the drain selection line voltage Vdsl may be applied to the drain selection line. The pass voltage Vpass may have a high voltage level and be less than the first to P-th program voltages Vpgnn1 to VpgmP. For example, the drain selection line voltage Vdsl may be a power voltage.

According to an embodiment of the present invention, when the first to P-th program operations are performed, first to P-th source selection line voltages Vssl1 to VsslP may be applied to the source selection line SSL. According to an embodiment, the first to P-th source selection line voltages Vssl1 to VsslP may gradually decrease. According to other embodiments, the first to X-th source selection line voltages Vssl1 to VsslX (where X is a natural number less than P) may have the same voltage level, and the X+1-th to P-th source selection line voltages VsslX+1 to VsslP may gradually decrease. This will be described in more detail with reference to FIGS. 6 to 11.

FIG. 6 is a flowchart illustrating an embodiment of the write operation of the semiconductor memory device 10.

Referring to FIGS. 1 and 6, the control logic 160 may determine whether the number of program loops performed reaches a predetermined reference value at step S210. When the control logic 160 determines that the number of program loops performed reaches the predetermined reference value (i.e., YES), the write operation may proceed with step S220.

It should be understood that the reference value may vary. For example, in a test operation after the semiconductor memory device 10 is manufactured, the reference value may be determined according to a test result. The reference value may vary depending on various factors such as characteristics of the semiconductor memory device 10 and patterns of the data DATA to be stored.

The control logic 160 may set the first selection line voltage generator 131 to generate the reduced source selection line voltage Vssl at step S220.

A program operation may be performed using the reduced source selection line voltage Vssl at step S231. It is determined whether the threshold voltages of the memory cells of the selected word line reach a desired level at step S232. According to a result of the determination (i.e., YES or NO), the write operation may proceed again with step S210. Step S230 includes both steps S231 and S232 as indicated at FIG. 6.

When the number of program operations performed is less than the predetermined reference number, a relatively small number of memory cells, among the memory cells of the selected word line, may have desired threshold voltages. This means that since a relatively large number of programmed cells are present, a cell string to be boosted and a cell string not to be boosted are more likely to be adjacent to each other (see FIG. 4A). At this time, the channel voltage of the cell string to be boosted may not increase normally.

As the number of program operations performed increases, a relatively large number of memory cells may have desired threshold voltages among the memory cells of the selected word line. This means that since a relatively large number of program-inhibited cells are present, cell strings to be boosted are more likely to be adjacent to each other. Here, a leakage current flowing through the source selection transistor SST (see FIG. 2) may increase (see FIG. 4).

According to an embodiment of the present invention, when the number of program operations performed is less than the reference value, the source selection line voltage Vssl, which is a positive voltage, may be used. Even when the cell string to be boosted and the cell string not to be boosted are adjacent to each other, the channel voltage of the cell string boosted by the source selection line voltage Vssl, which is the positive voltage, may increase normally.

According to an embodiment of the present invention, when the number of program operations performed reaches the reference value, the source selection line voltage Vssl may be reduced. Even when the cell strings to be boosted are adjacent to each other, the reduced source selection line voltage Vssl may suppress a leakage current that may flow through the source selection transistor SST (FIG. 2).

As a result, the reliability of the write operation of the semiconductor memory device 10 may be improved.

Figure 7:
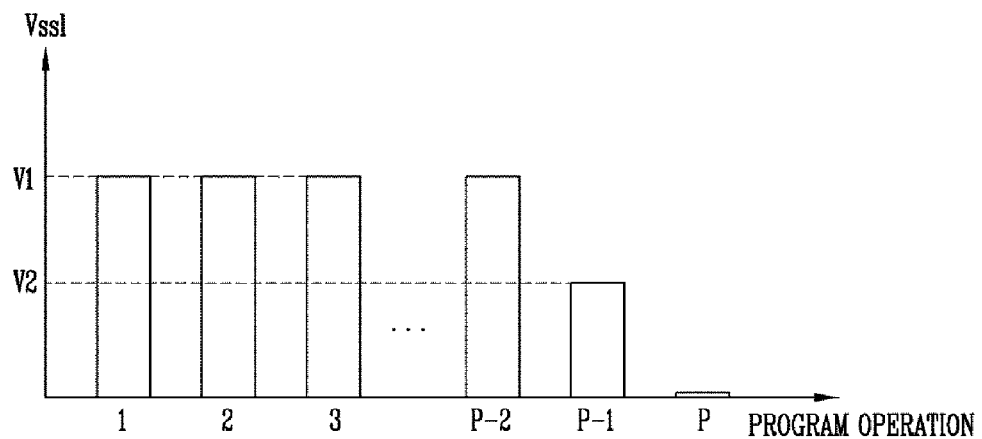
FIG. 7 is a graph illustrating a first example associated with various embodiments relating to a source selection line voltage during a write operation.

FIG. 7 is a graph illustrating a first example associated with various embodiments relating to the source selection line voltage Vssl during the write operation.

Referring to FIG. 7, when the first to P-th-2 program operations are performed, the source selection line voltage Vssl having a first voltage level V1 may be used.

When the number of program operations performed increases to the reference value, the source selection line voltage Vssl having a second voltage level V2 may be used. In an embodiment in FIG. 7, the source selection line voltage Vssl having the second voltage level V2 may be used during the P-1-th program operation.

When the number of program operations performed continuously increases to the next reference value, the source selection line voltage Vssl may change to a ground voltage. In the embodiment in FIG. 7, the source selection line voltage Vssl may change to the ground voltage during the P-th program operation.

Figure 8:
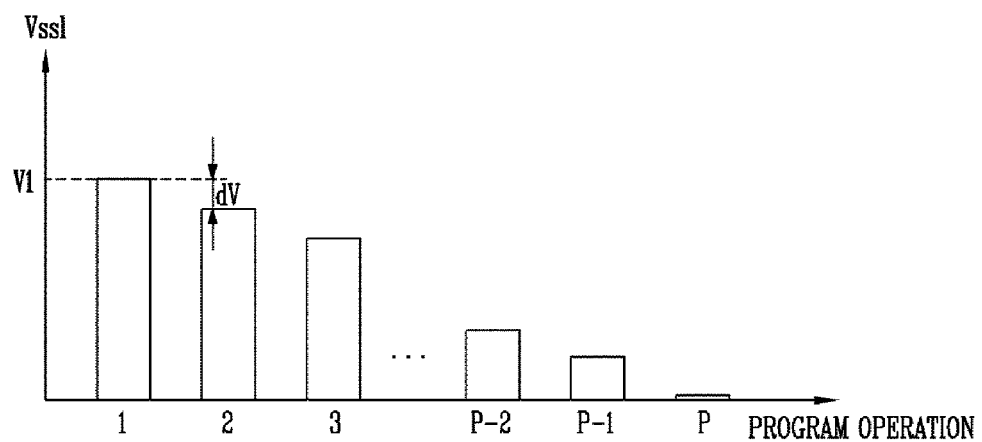
FIG. 8 is a graph illustrating a second example associated with various embodiments relating to the source selection line voltage.

FIG. 8 is a graph illustrating a second example associated with various embodiments relating to the source selection line voltage Vssl.

Referring to FIG. 8, the source selection line voltage Vssl may decrease each time the program operation is performed. During the first program operation, the source selection line voltage Vssl having the first voltage level V1 may be used. The source selection line voltage Vssl may be reduced by a predetermined voltage difference dV each time the program operation is performed (see, for example, program operations 2, 3, P-2, P-1, and P). In addition, during the P-th program operation, the source selection line voltage Vssl may reach the ground voltage.

FIG. 9 is a flowchart illustrating other embodiments of the write operation of the semiconductor memory device 10.

Referring to FIGS. 1 and 9, the control logic 160 may determine whether the number of program loops performed reaches a predetermined reference value at S310. When the control logic 160 determines that the number of program loops performed reaches the predetermined reference value (i.e., YES), the write operation may proceed with step S320.

The control logic 160 may set the first selection line voltage generator 131 to generate the increased source selection line voltage Vssl at step S320. A program operation (at step S331) may be performed by using the increased source selection line voltage Vssl. In addition, the write operation may proceed back to step S310 according to a result of the verify operation (at step S332). As seen from FIG. 9 step S330 includes steps S331 and S332.

During the program operation, when the cell string to be boosted and the cell string not to be boosted are adjacent to each other, the channel voltage of the cell string boosted by the coupling (a) (see FIG. 4) may be inadvertently reduced. Therefore, the threshold voltage of the program-inhibited cell may be inadvertently increased, and the data stored in the corresponding memory cell may be correspondingly damaged. As the program operations are repeated, the data stored in the corresponding memory cells are more likely to be damaged.

According to an embodiment of the present invention, when the number of program operations performed reaches the reference value, the source selection line voltage Vssl may increase. Thus, even when the cell string to be boosted and the cell string not to be boosted are adjacent to each other, the channel voltage of the cell string to be boosted may increase normally. Therefore, the data stored in the memory cells of the cell string to be boosted may be prevented from being damaged.

As a result, the reliability of the write operation of the semiconductor memory device 10 may be improved.

FIG. 10 is a graph illustrating a third example associated with various embodiments relating to the source selection line voltage Vssl during the write operation.

Referring to FIG. 10, when the first to P-2-th program operations are performed, the source selection line voltage Vssl may be a ground voltage. Subsequently, when the number of program operations performed increases to a first reference value, the source selection line voltage Vssl having the second voltage level V2 may be used. In this third example associated with the various embodiments relating to FIG. 10, the first reference value may be P-1.

When the number of program operations performed increases to a second reference value, the source selection line voltage Vssl may change from the second voltage level V2 to the first voltage level V1. In this third example associated with the various embodiments relating to FIG. 10, the second reference value may be P.

Figure 11:
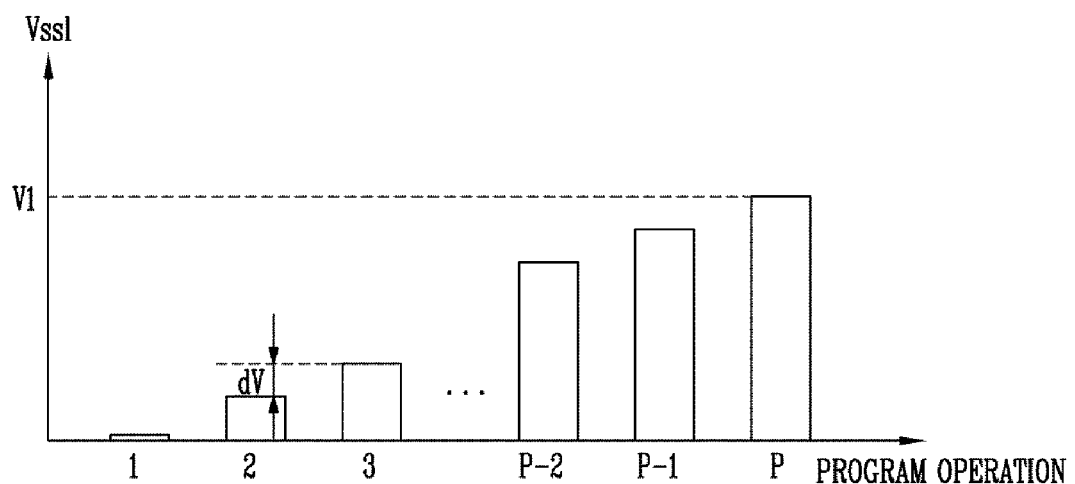
FIG. 11 is a graph illustrating a fourth example associated with various embodiments relating to the source selection line voltage during the write operation.

FIG. 11 is a graph illustrating a fourth example associated with various embodiments relating to the source selection line voltage Vssl during the write operation.

Referring to FIG. 11, as the number of program operations performed increases, the source selection line voltage Vssl may increase. During the first program operation, the source selection line voltage Vssl may be a ground voltage. The source selection line voltage Vssl may increase by the predetermined voltage difference dV each time the program operation is performed (see, for example, program operations 2, 3, P-2, P-1, and P). In addition, the source selection line voltage Vssl may reach the first voltage level V1 during the P-th program operation.

Figure 12:
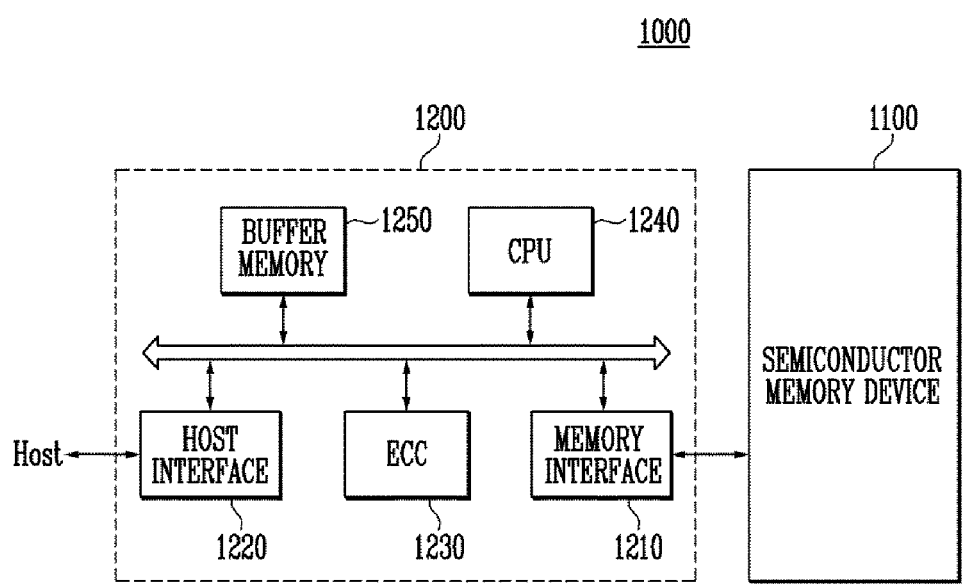
FIG. 12 is a block diagram of a memory system including a semiconductor memory device.

FIG. 12 is a block diagram of a memory system 1000 that includes a semiconductor memory device 1100.

Referring to FIG. 12, the memory system 1000 may include the semiconductor memory device 1110 and a memory controller 1200.

The semiconductor memory device 1100 may be configured and operated in substantially the same manner as the semiconductor memory device 10 described above with reference to 1. Hereinafter, a description of the contents of the semiconductor memory device 1100 the same as the semiconductor memory device 10 is omitted.

The controller 1200 may be coupled to a host and the semiconductor memory device 1100. In response to a request from the host, the controller 1200 may be configured to access the semiconductor memory device 1100. For example, the controller 1200 may be configured to control read, write, erase and background operations of the semiconductor memory device 100. The controller 1200 may be configured to provide an interface between the semiconductor memory device 1100 and the host. The controller 1200 may be configured to drive firmware for controlling the semiconductor memory device 1100.

The controller 1200 may include a memory interface 1210, a host interface 1220, an error check and correct circuit (ECC) 1230, a central processing unit (CPU) 1240 and a buffer memory 1250.

The memory interface 1210 may transmit data transferred from the buffer memory 1250 to the semiconductor memory device 1100. In addition, the memory interface 1210 may transfer data read from the semiconductor memory device 1100 to the buffer memory 1250. Here, the memory interface 1210 may use an interface method of a NAND flash memory. In other words, the controller 1200 may perform program, read and erase operations by using the NAND flash memory interface method.

The host interface 1220 may include a protocol for data exchange between the host and the controller 1200. According to an embodiment, the host interface 1220 may be configured to communicate with the host through at least one of the following protocols: a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol and a private protocol.

The ECC circuit 1230 may generate a parity bit by using the data transferred to the semiconductor memory device 1100. The generated parity bit may be stored in a spare area of semiconductor memory chips of the semiconductor memory device 1100. The ECC circuit 1230 may detect an error in data read from the semiconductor memory chips of the semiconductor memory device 1100. When the detected error is in a correctable range, the ECC circuit 1230 may correct the detected error.

The CPU 1240 may analyze and process a signal which is input from the host. The CPU 1240 may control the host or the semiconductor memory chips of the semiconductor memory device 1100 through the host interface 2220 or the memory interface 1210.

The CPU 1240 may control the semiconductor memory device 1100 by the firmware for controlling the semiconductor memory device 1100.

The buffer memory 1250 may temporarily store program data provided from the host or the data read from the semiconductor memory device 1100. In addition, the buffer memory 1250 may store meta data or cache data to be stored in the semiconductor memory device 1100. In a sudden power-off operation, the meta data or cache data stored in the buffer memory 1250 may be stored in the semiconductor memory device 1100. For example, the buffer memory 1250 may include a DRAM or an SRAM.

The controller 1200 and the semiconductor memory device 1100 may be integrated into a single semiconductor device. According to an embodiment, the controller 1200 and the semiconductor memory 1100 may be integrated into a single semiconductor device to form a memory card. For example, the controller 1200 and the semiconductor memory device 1100 may be integrated into a single semiconductor device to form a memory card such as a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 1200 and the semiconductor memory device 1100 may be integrated into a single semiconductor device to form a semiconductor drive (solid state drive (SSD)).

The semiconductor drive (SSD) may include a storage device configured to store data in a semiconductor memory. When the memory system 1000 is used as the semiconductor drive (SSD), an operating speed of the host coupled to the memory system 1000 may be significantly increased.

In another example, the memory system 1000 may be provided as any one of various types of electronic devices, such as computers, ultra-mobile PCs (UMPCs), workstations, net-books, personal digital assistants (PDAs), portable computers, web tablets, wireless phones, mobile phones, smart phones, e-book readers, portable multimedia players (PMPs), portable game machines, navigation devices, black boxes, digital cameras, three-dimensional televisions, digital audio recorders, digital audio players, digital picture recorders, digital picture players, digital video recorders and digital video players; any one of various electronic devices constituting a telematics network; an RFID device; or any one of various types of components constituting a computing system.

According to an embodiment, the semiconductor memory device 1100 or the memory system 1000 may be assembled into any of various types of packages. For example, the semiconductor memory device 1100 or the memory system 1000 may be packaged in package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flapjack (TQFP), small outline integrated circuits (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

Figure 13:
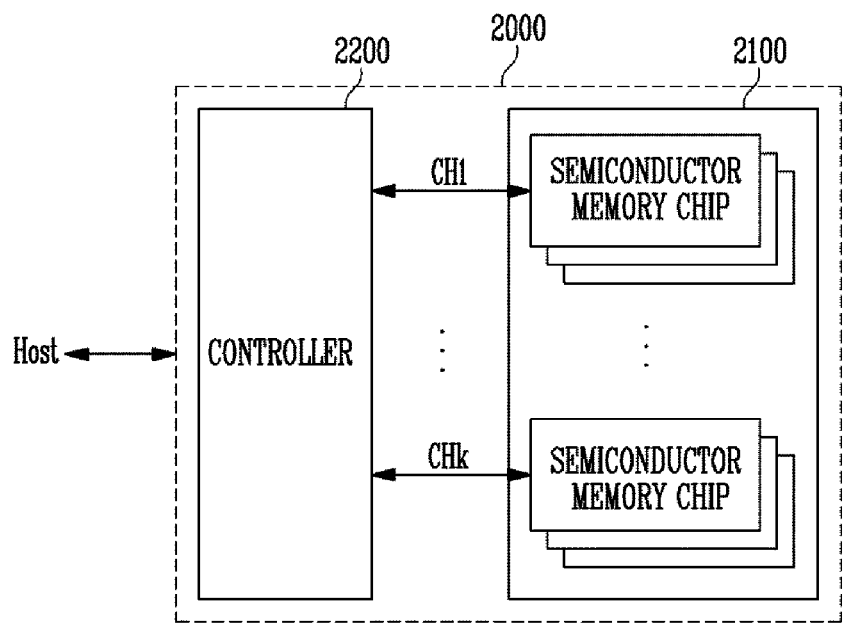
FIG. 13 is a block diagram illustrating an example of an application of the memory system of FIG. 12.

FIG. 13 is a block diagram of an application example (2000) of the memory system 1000 found in FIG. 12.

Referring to FIG. 13, a memory system 2000 may include a semiconductor memory device 2100 and a controller 2200. The semiconductor memory device 2100 may include a plurality of semiconductor memory chips. The plurality of semiconductor memory chips may be divided to a plurality of groups.

As illustrated in FIG. 13, the plurality of groups may communicate with the controller 2200 through first to k-th channels CH1 to CHk. Each of the semiconductor chips may be configured and operated in substantially the same manner as the semiconductor memory device 10 as described above with reference to FIG. 1.

Each of the groups may be configured to communicate with the controller 2200 through a single common channel. The controller 2200 may have substantially the same configuration as the controller 1200 as described above with reference to FIG. 12 and may be configured to control the plurality of memory chips of the semiconductor memory device 2100 through the first to k-th channels CH1 to CHk.

As illustrated in FIG. 13, the plurality of semiconductor memory chips may be coupled to a single channel. However, it should be understood that the memory system 2000 may be modified so that a single memory chip may be coupled to a single channel.

Figure 14:
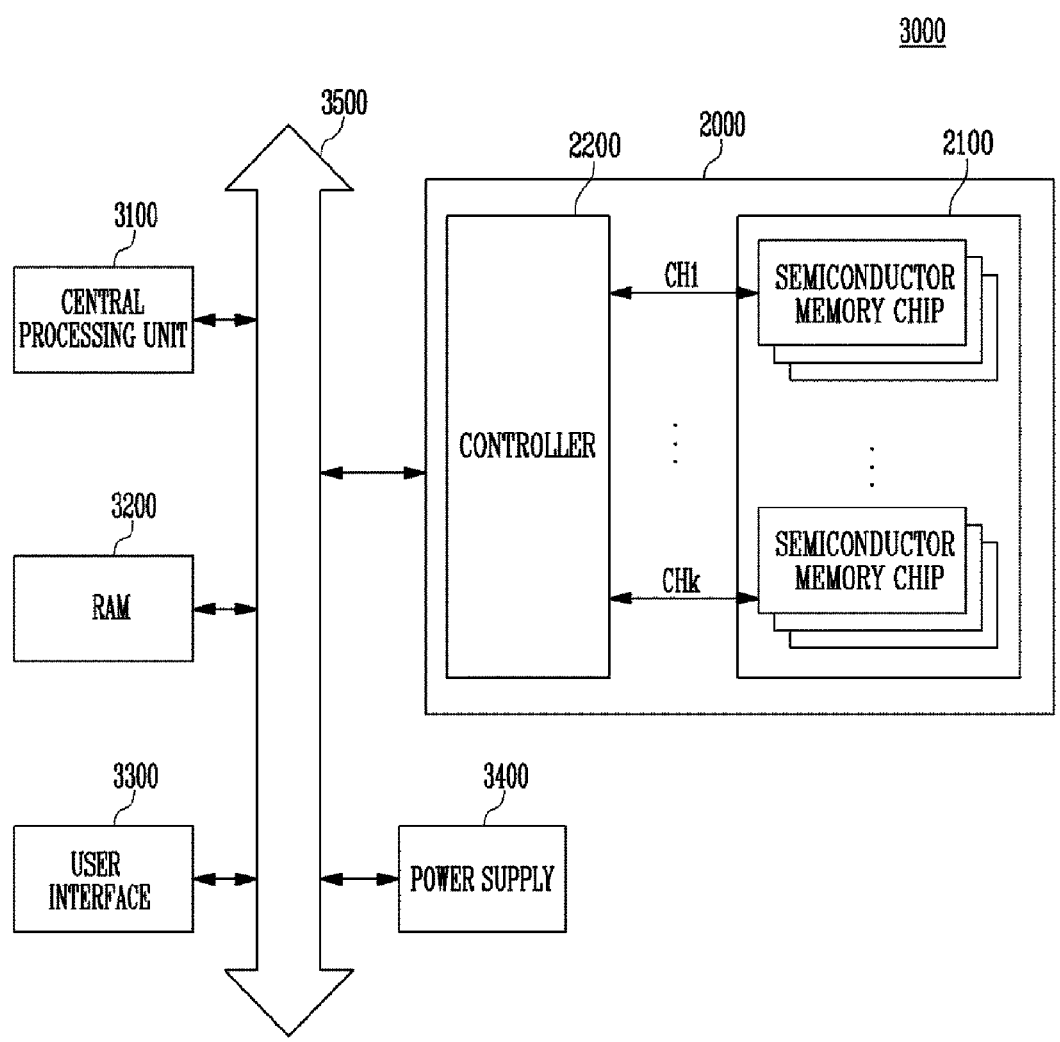
FIG. 14 is a block diagram of a computing system including the memory system described with reference to FIG. 13.

FIG. 14 is a block diagram of a computing system 3000 that includes the memory system 2000 as described above with reference to FIG. 13.

Referring to FIG. 14, the computing system 3000 may include a central processing unit (CPU) 3100, a random access memory (RAM) 3200, a user interface 3300, a power supply 3400, a system bus 3500 and a memory system 2000.

The memory system 2000 may be electrically connected to the CPU 3100, the RAM 3200, the user interface 3300 and the power supply 3400 through the system bus 3500. The memory system 2000 may store data provided through the user interface 3300 or processed by the CPU 3100.

As illustrated in FIG. 14, the semiconductor memory device 2100 may be coupled to the system bus 3500 through the controller 2200. However, the semiconductor memory device 2100 may be directly coupled to the system bus 3500. Functions of the controller 2200 may be performed by the CPU 3100 and the RAM 3200.

As illustrated in FIG. 14, the computing system 3000 may include the memory system 2000 as described with reference to FIG. 13. However, the memory system 2000 may be replaced by the memory system 1000 as described above with reference to FIG. 12. According to an embodiment, the computing system 3000 may include both memory systems 1000 and 2000 as described above with reference to FIGS. 12 and 13.

The embodiments of the present invention may provide a semiconductor memory device having improved reliability.

What is claimed is:

1. A writing method of a semiconductor memory device, the writing method comprising:
    applying a plurality of program voltages sequentially generated to a selected word line; and
    applying any one of a plurality of source selection line voltages to a source selection line when each of the plurality of program voltages is applied,
    wherein the any one of the plurality of source selection line voltages is determined according to whether or not the number of times that the program voltages are applied reaches a first reference value.

2. The writing method of claim 1, wherein the applying of the any one of the plurality of source selection line voltages includes:
    applying a first source selection line voltage to the source selection line when the number of times is less than the first reference value; and
    applying a second source selection line voltage to the source selection line when the number of times is greater than or equal to the first reference value,
    wherein the second source selection line voltage is less than the first source selection line voltage.

3. The writing method of claim 1, wherein the applying of any one of the plurality of source selection line voltages comprises:
    applying a first source selection line voltage to the source selection line when the number of times is less than the first reference value; and
    applying a second source selection line voltage to the source selection line when the number of times
    is greater than or equal to the first reference value, wherein the second source selection line voltage is higher than the first source selection line voltage.

4. The writing method of claim 1, wherein the any one of the plurality of source selection line voltages is determined according to whether or not the number of times that the program voltages are applied reaches the first reference value and a second reference value, and the second reference value is greater than the first reference value.

5. The writing method of claim 4, wherein the applying of the any one of the plurality of source selection line voltages includes:
    applying a first source selection line voltage to the source selection line when the number of times is less than the first reference value;
    applying a second source selection line voltage to the source selection line when the number of times is greater than or equal to the first reference value and less than the second reference value; and
    applying a third source selection line voltage to the source selection line when the number of times is greater than or equal to the second reference value,
    wherein the first to third source selection line voltages gradually decrease.

6. The writing method of claim 4, wherein the applying of the any one of the plurality of source selection line voltages includes:
    applying a first source selection line voltage to the source selection line when the number of times is less than the first reference value;
    applying a second source selection line voltage to the source selection line when the number of times is greater than or equal to the first reference value and less than the second reference value; and
    applying a third source selection line voltage to the source selection line when the number of times is greater than or equal to the second reference value,
    wherein the first to third source selection line voltages gradually increase.

7. The writing method of claim 1, wherein in the applying of the any one of the plurality of source selection line voltages, after the number of times that the program voltages are applied reaches the first reference value, the source selection line voltages applied to the source selection line decreases as the number of times that the program voltages are applied increases.

8. The writing method of claim 1, wherein in the applying of the any one of the plurality of source selection line voltages, after the number of times that the program voltages are applied reaches the first reference value, the source selection line voltage applied to the source selection line increases as the number of times that the program voltages are applied increases.

9. The writing method of claim 1, wherein a pass voltage lower than the plurality of program voltages is applied to an unselected word line, and a power voltage is applied to a drain selection line when the plurality of program voltages are applied.

10. A semiconductor memory device, comprising:
    a memory cell array including a plurality of memory cells and source selection transistors coupled between the plurality of memory cells and a common source line; and
    a peripheral circuit configured to write data in selected memory cells among the plurality of memory cells by performing a plurality of program operations,
    wherein the peripheral circuit is configured to apply any one of a plurality of source selection line voltages to the source selection transistors when each of the plurality of program perations is performed,
    wherein the peripheral circuit selects the any one of the plurality of source selection line voltages according to whether or not the number of times that the program operations are performed reaches a reference value.

11. The semiconductor memory device of claim 10, wherein the peripheral circuit applies a first source selection line voltage to the source selection line when the number of times that the program operations are performed is less than the reference value, and the peripheral circuit applies a second source selection line voltage to the source selection line when the number of times that the program operations are performed is greater than or equal to the reference value,
    wherein the second source selection line voltage is less than the first source selection line voltage.

12. The semiconductor memory device of claim 10, wherein the peripheral circuit applies a first source selection line voltage to the source selection line when the number of times that the program operations are performed is less than the reference value, and the peripheral circuit applies a second source selection line voltage to the source selection line when the number of times that the program operations are performed is greater than or equal to the reference value,
    wherein the second source selection line voltage is higher than the first source selection line voltage.

13. The semiconductor memory device of claim 10, wherein the peripheral circuit applies a low source selection line voltage to the source selection line as the number of times that the program operations are performed increases after the number of times that the program operations are performed reaches the reference value.

14. The semiconductor memory device of claim 10, wherein the peripheral circuit applies a high source selection line voltage to the source selection line as the number of times that the program operations are performed increases after the number of times that the program operations are performed reaches the reference value.

15. A semiconductor memory device, comprising:
- a memory cell array coupled to a drain selection line, a source selection line and a plurality of word lines between the drain selection line and the source selection line;
- a word line voltage generator configured to generate a plurality of program voltages to be applied to a selected word line among the plurality of word lines during a write operation; and
- a first selection line voltage generator configured to generate any one of plurality of source selection line voltages when each of the plurality of program voltages are generated,
- wherein the source selection line voltage generated by the first selection line voltage generator is applied to the source selection line,
- wherein the any one of the plurality of source selection line voltages is determined according to whether or not the number of times that the program voltages are applied reaches a reference value.

16. The semiconductor memory device of claim 15, further comprising a second selection line voltage generator configured to generate a drain selection line voltage to be applied to the drain selection line.

17. A computer system including a semiconductor memory device and a central processing unit, the semiconductor memory device comprising:
- a memory cell array including a plurality of memory cells and source selection transistors coupled between the plurality of memory cells and a common source line; and
- a peripheral circuit configured to write data in selected memory cells among the plurality of memory cells by performing a plurality of program operations,
- wherein the peripheral circuit is configured to apply any one of a plurality of source selection line voltages to the source selection transistors when each of the plurality of program operations is performed,
- wherein the peripheral circuit selects the any one of the plurality of source selection line voltages according to whether or not the number of times that the program operations are performed reaches a reference value.

* * * * *